US012695054B2

(12) United States Patent (10) Patent No.: US 12,695,054 B2
Zur (45) Date of Patent: Jul. 28, 2026

(54) PRECISION IN STEREOSCOPIC MEASUREMENTS USING A PRE-DEPOSITION LAYER

(71) Applicant: APPLIED MATERIALS ISRAEL LTD., Rehovot (IL)

(72) Inventor: Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 703 days.

(21) Appl. No.: 17/983,225

(22) Filed: Nov. 8, 2022

(65) Prior Publication Data

US 2024/0153738 A1 May 9, 2024

(51) Int. Cl.
*G06T 5/73* (2024.01)
*H01J 37/22* (2006.01)
*H01J 37/28* (2006.01)

(52) U.S. Cl.
CPC ............ *H01J 37/28* (2013.01); *H01J 37/222* (2013.01); *H01J 2237/2815* (2013.01)

(58) Field of Classification Search
CPC .. H01J 37/00; H01J 37/02; H01J 37/26; H01J 37/28; H01J 37/222; H01J 2237/2815; H01J 2237/30466
USPC ................................ 250/306, 307, 310, 311
See application file for complete search history.

(56) References Cited

U.S. PATENT DOCUMENTS 5,443,684 A 8/1995 Eckart et al.
6,670,610 B2 12/2003 Shemesh et al.

8,709,269 B2 4/2014 Shemesh
2005/0100205 A1 5/2005 Shishido et al.
2006/0103035 A1* 5/2006 Maruyama .......... H01J 37/3045
257/E23.179

(Continued)

FOREIGN PATENT DOCUMENTS

EP 2939261 B1 8/2016
JP 1145679 A 2/1999

(Continued)

OTHER PUBLICATIONS

PCT/US2023/075265, "International Search Report and Written Opinion", Jan. 18, 2024, 10 pages.

(Continued)

*Primary Examiner* — Jason L McCormack
(74) *Attorney, Agent, or Firm* — Kilpatrick Townsend & Stockton LLP

(57) ABSTRACT

A method of determining the depth of a hole milled into a first region of a sample, the method comprising: positioning the sample in a processing chamber having a charged particle beam column; depositing material directly over a top surface of the sample in a second region of the sample adjacent to the first region; milling the hole in the first region of the sample using a charged particle beam generated by the charged particle beam column, wherein the hole abuts the material deposited over the top surface and includes a sidewall that extends from a bottom surface of the hole to an interface between the deposited material and the top surface of the sample; and using stereoscopic measurement techniques to calculate the depth of the hole based on distance measurements between a first point along an interface between the material and the top surface and a second point along a bottom surface of the hole.

17 Claims, 14 Drawing Sheets

(56)         References Cited

U.S. PATENT DOCUMENTS

| | | | |
|---|---|---|---|
| 2007/0018099 A1* | 1/2007 | Chitturi | G01B 15/08 |
| | | | 250/492.21 |
| 2007/0272854 A1 | 11/2007 | Agorio et al. | |
| 2008/0290291 A1 | 11/2008 | Kaga | |
| 2015/0348751 A1* | 12/2015 | Brogden | H01J 37/3023 |
| | | | 250/307 |
| 2018/0005906 A1 | 1/2018 | Sagawa et al. | |
| 2018/0301319 A1* | 10/2018 | Stone | H01J 37/317 |
| 2019/0170509 A1 | 6/2019 | Kawada | |
| 2022/0254060 A1* | 8/2022 | Najarian | G06T 7/74 |

FOREIGN PATENT DOCUMENTS

| | | | |
|---|---|---|---|
| JP | 2006156152 A | 6/2006 |
| JP | 2016503890 A | 2/2016 |
| JP | 6427571 B2 | 11/2018 |
| KR | 20090091157 A | 8/2009 |

OTHER PUBLICATIONS

PCT/US2023/075265, "International Preliminary Report on Patentability", May 22, 2025, 7 pages.
KR10-2025-7018241, "Office Action", Dec. 31, 2025, 6 pages.
JP2025-525713, "Office Action", Apr. 21, 2026, 7 pages.

* cited by examiner

400

422
420
424
410

410
400
420

400

420

410

900

910
Position Sample in Processing Chamber

920
Move Region to be Milled under Focused Ion Beam Column

930
Deposit Material along Perimeter of Region to be Milled

940
Mill Hole in Sample

950
Measure Hole Depth from a First Perspective

960
Measure Hole Depth from a Second Perspective

970
Determine Depth of Hole

PRECISION IN STEREOSCOPIC MEASUREMENTS USING A PRE-DEPOSITION LAYER

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon wafer that includes one or more electronic structures formed thereon can be milled and analyzed with a focused ion beam (FIB) to study specific characteristics of the structures formed on the wafer.

It is often desirable to determine the precise depth of a hole that is milled in a sample. Scanning electron microscopy (SEM) techniques can be beneficially used to determine the depth of a milled hole. In some instances, however, during the milling process the top surface of a sample can get partially milled away in the area immediately surrounding the milled hole. For example, in some FIB instruments, such as a plasma source FIB system, the focused ion beam can have a relatively large "tail" around the spot which can create damage at the surface of the sample outside the immediate area in which the beam is focused. The damaged top surface can adversely impact the accuracy of the thickness determination.

Accordingly, improved methods for accurately determining the depth of a milled hole in a sample are desired.

BRIEF SUMMARY OF THE INVENTION

Embodiments described herein provide improved systems and methods for measuring the depth of a hole milled in a sample. In some embodiments, a hole (e.g., a box, a trench or other structure milled into a sample) is milled in a sample using a focused ion beam (FIB) as part of a sample evaluation process. As stated above, in some instances the top surface of the sample can potentially be damaged from the milling process in the area immediately surrounding the hole. To ensure that measurements of the depth of the hole are highly precise, it is important that the distance being measured is between the top surface as the surface existed prior to milling the hole and the bottom surface of the hole. Any damage at the top surface near the hole can make it difficult to accurately identify the precise location of the top surface.

Some embodiments disclosed herein enable highly precise measurements of the depth of a milled hole even if the surface of the sample is damaged during the milling process. To do such, some embodiments deposit a small amount of material on the surface of the sample next to the area to be milled prior to the milling process. This small deposition can be partly milled during the milling process forming a high contrast boundary between the deposited material and the original surface. Images of the hole along the sidewall can be obtained from two different perspectives and the high contrast boundary can be used in the images as the precise height of the original surface. With the precise height of the original surface known, distances between the top surface of the sample and bottom surface of the milled hole along the sidewall of the hole can be obtained, and the depth of the hole can be determined as described herein.

While embodiments of the disclosure can be used to perform measurements on a holes milled into a variety of different types of samples, some embodiments are particularly useful in performing measurements on samples that are semiconductor wafers or similar specimens.

In some embodiments, a method of determining the depth of a hole milled into a first region of a sample is provided. The method can include: positioning the sample in a processing chamber having a charged particle beam column; depositing material directly over a top surface of the sample in a second region of the sample adjacent to the first region; milling the hole in the first region of the sample using a charged particle beam generated by the charged particle beam column, wherein the hole abuts the material deposited over the top surface and includes a sidewall that extends from a bottom surface of the hole to an interface between the deposited material and the top surface of the sample; and using stereoscopic measurement techniques to calculate the depth of the hole based on distance measurements between a first point along an interface between the material and the top surface and a second point along a bottom surface of the hole.

A system for determining the depth of a hole milled into a first region of a sample is provided in some embodiments. The system can include: a vacuum chamber; a sample support configured to hold a sample within the vacuum chamber during a milling process; a charged particle beam column configured to direct a charged particle beam into the vacuum chamber; and a processor and a memory coupled to the processor. The memory can include a plurality of computer-readable instructions that, when executed by the processor, cause the system to: position the sample in a processing chamber having a charged particle beam column; deposit material directly over a top surface of the sample in a second region of the sample adjacent to the first region; mill the hole in the first region of the sample using a charged particle beam generated by the charged particle beam column; and use stereoscopic measurement techniques to calculate the depth of the hole. The hole can abut the material deposited over the top surface and include a sidewall that extends from a bottom surface of the hole to an interface between the deposited material and the top surface of the sample. The depth of the hole can be calculated based on distance measurements between a first point along an interface between the material and the top surface and a second point along a bottom surface of the hole.

In some embodiments, a non-transitory computer-readable memory that stores instructions for determining the depth of a hole milled into a first region of a sample is provided. The instructions can, when executed by a processor, cause the milling by: positioning the sample in a processing chamber having a charged particle beam column; depositing material directly over a top surface of the sample in a second region of the sample adjacent to the first region; milling the hole in the first region of the sample using a charged particle beam generated by the charged particle beam column, wherein the hole abuts the material deposited over the top surface and includes a sidewall that extends from a bottom surface of the hole to an interface between the deposited material and the top surface of the sample; and using stereoscopic measurement techniques to calculate the depth of the hole based on distance measurements between a first point along an interface between the material and the top surface and a second point along a bottom surface of the hole.

In some embodiments, the stereoscopic measurement techniques used to calculate the depth of the hole can include: (i) obtaining first and second images of the sidewall at different perspectives; (ii) for each of the first and second images, measuring a distance between a first point along an interface between the material and the top surface and a second point along a bottom surface of the hole; and (iii) calculating the depth of the hole based on the first and second images and the measured distances.

In some embodiments, the stereoscopic measurement techniques used to calculate the depth of the hole can include: (i) obtaining a first image of the sidewall of the spot, the first image obtained from a first perspective associated with a first angle relative to the sample; (ii) measuring, using the first image, a first distance between a first point on the sidewall at the interface between the deposited material and the top surface of the sample and a second point on the sidewall corresponding to a bottom surface of the hole; (iii) obtaining a second image of the sidewall of the spot, the second image obtained from a second perspective associated with a second angle relative to the sample, wherein the first angle and first perspective are different from the second angle and the second perspective; (iv) measuring, using the second image, a second distance between the first point on the sidewall corresponding to the interface between the deposited material and the top surface of the sample and the second point on the sidewall corresponding to the bottom surface of the hole, wherein the first point and the second point fall approximately on a line extending vertically through the milled hole; and (v) determining a depth of the hole using the first distance, the first angle associated with the first perspective, the second distance, and the second angle associated with the second perspective.

In various implementations, embodiments can include one or more of the following features. The charged particle beam column can be a focused ion beam (FIB) column and the charged particle beam can be a focused ion beam. Depositing the material can include: (i) injecting a deposition precursor gas into the second region of sample; (ii) generating a focused ion beam with the focused ion beam column and focusing the ion beam within the second region of the sample; and (iii) scanning the focused particle beam across the second region of the sample to activate molecules of the deposition gas that have adhered to the sample surface in the deposition region and deposit material on the sample within the second region. The processing chamber can be a vacuum chamber that includes both a focused ion beam (FIB) column and a scanning electron microscope (SEM) column. The sample can be a semiconductor wafer. Each of the first and second images can be obtained using a scanning electron microscopy (SEM) technique.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments described herein provide improved systems and methods for measuring the depth of a hole milled in a sample. In some embodiments, a hole is milled in a sample using a focused ion beam (FIB) as part of a sample evaluation process. During a typical milling process, the top surface of the sample can potentially be damaged in the area immediately surrounding the hole making it difficult to determine the exact position of the original top surface. Some embodiments disclosed herein deposit a small amount of material on the surface of the sample next to the area to be milled prior to the milling process. This small deposition can be partly milled during the milling process forming a high contrast boundary between the deposited material and the original surface thus preserving the exact location of the original top surface of the sample. Images of the buried layer along the sidewall can then be obtained from two different perspectives and the high contrast boundary can be used in the images as the precise height of the original surface. With the precise height of the original surface known, accurate distances between the original top surface of the sample and the bottom surface of the milled hole along the sidewall can be obtained, and the depth of the hole can be accurately determined as described herein.

As used herein, the term "hole" can refer generically to a box, a trench or other structure milled into a sample where one or more surfaces of the hole are below the original surface of the sample prior to the milling operation.

Example Focused Ion Beam (FIB) Tool

Figure 1A:
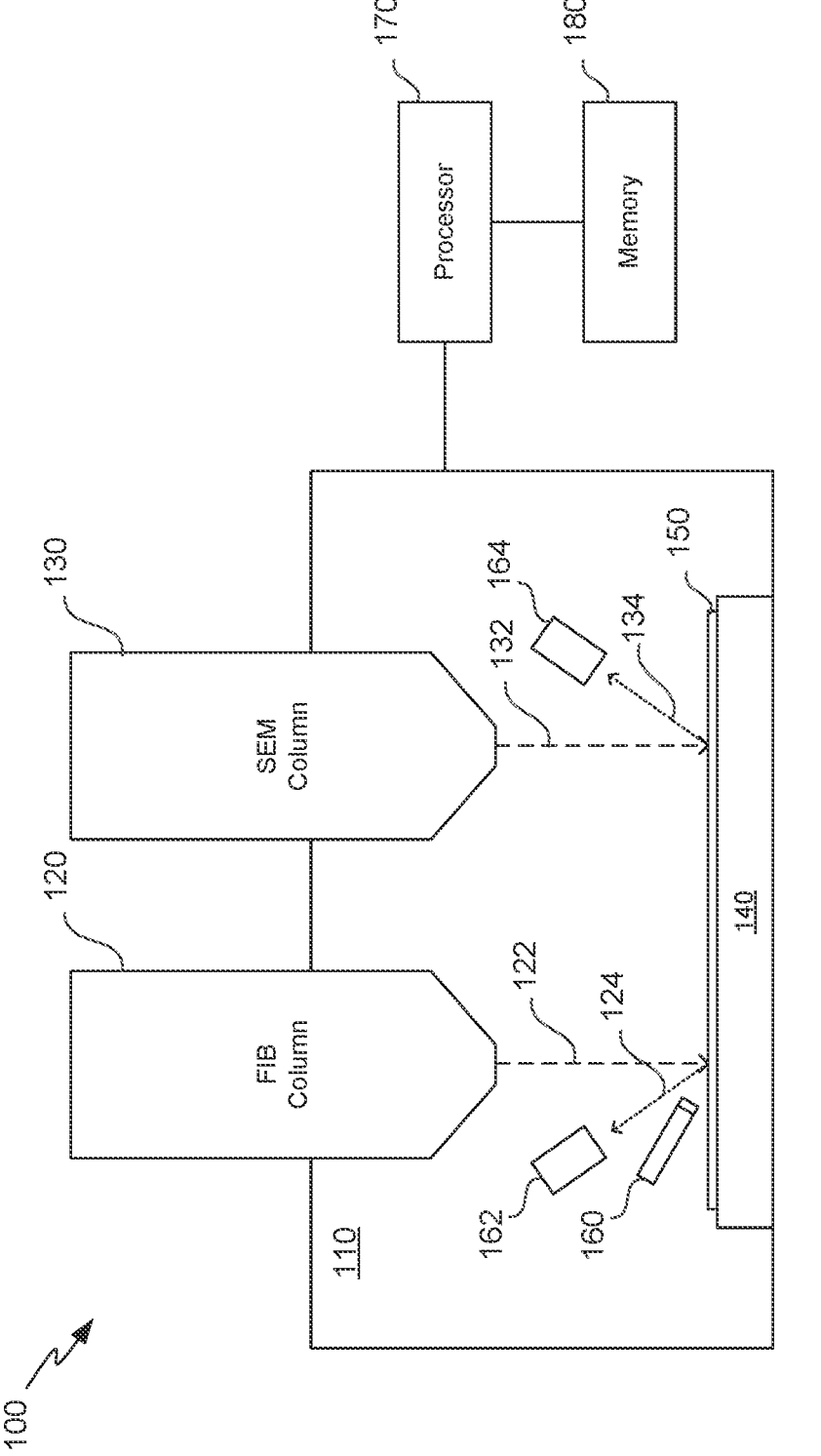
FIG. 1A is a simplified illustration of a sample evaluation system according to some embodiments of the disclosure.

In order to better understand and appreciate the disclosure, reference is first made to FIG. 1A, which is a simplified schematic illustration of a sample evaluation system 100 in accordance to some embodiments of the disclosure. Sample evaluation system 100 can be used for, among other operations, defect review and analysis of structures formed on samples such as semiconductor wafers.

As shown in FIG. 1A, sample evaluation system 100 can include, among other elements, a vacuum chamber 110, a focused ion beam (FIB) column 120, a scanning electron microscope (SEM) column 130, a sample supporting element 140, a gas injection nozzle 160 and, optionally, secondary electron detectors 162, 164 (or in some embodiments, secondary ion detectors, or a combination of the two detectors working in parallel). FIB column 120 and SEM column 130 are connected to vacuum chamber 110 so that a charged particle beam generated by either one of the charged particle columns propagates through a vacuumed environment formed within vacuum chamber 110 before impinging on sample 150. For example, FIB column 120 is operable to generate a charged particle beam 122 and direct the charged particle beam 122 towards a sample 150 (sometimes referred to herein as an "object" or a "specimen") to mill or otherwise process the sample. SEM column 130 can generate an image of a portion of sample 150 by illuminating the sample with a charged particle beam 132, detecting particles emitted due to the illumination, and generating charged particle images based on the detected particles.

The sample 150, for example a semiconductor wafer, can be supported on the sample supporting element 140 within vacuum chamber 110. Sample supporting element 140 can also move regions of the sample within vacuum chamber 110 between the field of view of the two charged particle columns 120 and 130 as required for processing. For example, the FIB column 120 can be used to mill a region on the sample 150 and the supporting element 140 can then move the sample so that the SEM column 130 can image the milled region of the sample 150.

FIB column 120 can mill (e.g., drill a hole in) sample 150 by irradiating the sample with one or more charged particle beams to form a cross section or a hole. An FIB milling process typically operates by positioning the specimen in a vacuum chamber 110 and emitting a beam of ions towards the specimen to etch or mill away material on the specimen. Common milling processes form a cross section of the sample 150 and, if desired, can also smooth the cross section. In some instances, the vacuum environment can be purged with background gases that serve to control the etch speed and other parameters. The accelerated ions can be generated from Xenon, Gallium or other appropriate elements and are typically accelerated towards the specimen by voltages in the range of 500 volts to 100,000 volts, and more, typically falling in the range of 3,000 volts to 30,000 volts. The beam current is typically in the range from several pico amps to several micro amps, depending on the FIB instrument configuration and the particular application, and the pressure is typically controlled between $10^{-10}$ to $10^{-5}$ mbar in different parts of the system and in different operation modes.

During a milling operation, the charged particle beam 122 generated by the FIB column 120 propagates through a vacuum environment formed within vacuum chamber 110 before impinging on the sample 150. Secondary electrons and ions 124 are generated in the collision of ions with the sample and can be detected by the detector 162. The detected secondary electrons or ions 124 can be used to analyze characteristics of the milled layers and the structure, can be used to determine an endpoint of a milling process, and/or can be used to form an images.

During a particle imaging operation, the charged particle beam 132 generated by the SEM column 130 propagates through the vacuum environment formed within the vacuum chamber 110 before impinging on the sample 150. Secondary electrons 134 are generated in the collision of electrons with the sample 150 and can be detected by the detector 164. The detected secondary electrons 134 can be used to form images of the milled area and/or to analyze characteristics of the milled layers and the structure.

Particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

During some processing operations, one or more gases can be delivered into chamber 110 by a gas injection system 160. For simplicity of explanation gas injection system 160 is illustrated in FIG. 1 as a nozzle, but it is noted that gas injection system 160 can include gas reservoirs, gas sources, valves, one or more inlets and one or more outlets, among other elements. In some embodiments gas injection system 160 can be configured to deliver gas to a localized area of sample 150 that is exposed to the charged particle beam as opposed to delivering gas to an entire upper surface of the sample. For example, in some embodiments gas injection system 160 has a nozzle diameter measured in hundreds of microns (e.g., between 400-500 microns) that is configured to deliver gas directly to a relatively small portion of the sample's surface that encompasses the charged particle beam scan pattern or collision zone. In various embodiments, a first gas injection system 160 can be configured to deliver gas to a sample disposed under FIB column 120 and a second gas injection system 160 (not shown) can be configured to deliver gas to a sample disposed under SEM column 130.

As shown in FIG. 1, system 100 can include one or more controllers, processors or other hardware units 170 that control the operation of system 100 by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Figure 1B:
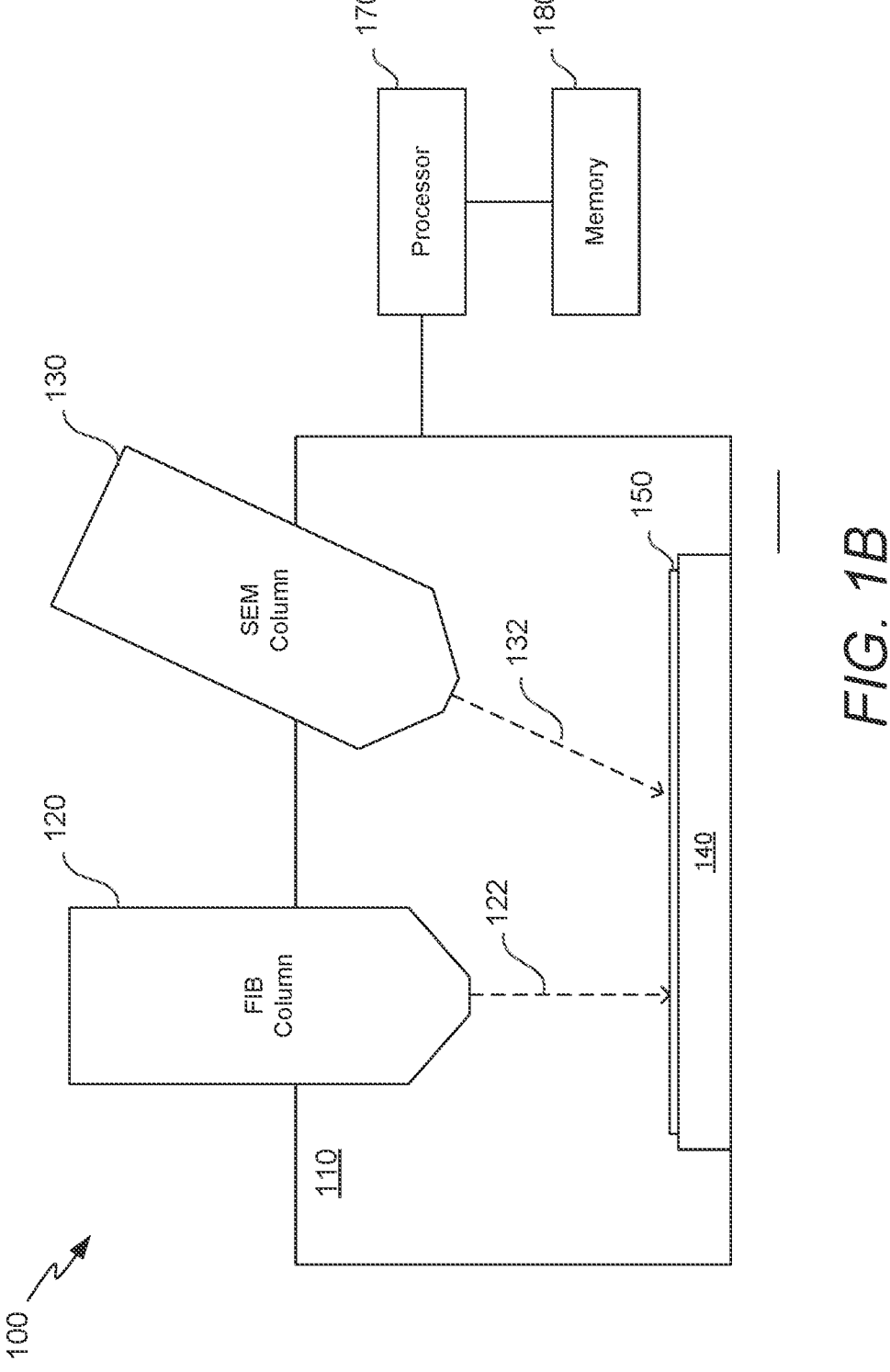
FIG. 1B is simplified illustration of a sample evaluation system shown in FIG. 1A with the SEM column tilted according to some embodiments.

FIG. 1B shows the substrate inspection system 100 with the SEM column 130 tilted. As explained more fully below, SEM column 130 can be tilted relative to a surface of the sample 150 to obtain images from different angles relative to a surface of sample 150 (or from different perspectives). Alternatively, in some embodiments, the supporting element 140 can be configured to tilt the sample 150 so that images can be obtained from different angles. Gas nozzle 160 and detectors 162, 164 are not shown in FIG. 1B for ease of illustration.

The inspection system 100 shown in FIGS. 1A and 1B is provided as an example of a system that can be used with some of the embodiments described herein. It should be appreciated that the embodiments are not limited to the inspection system 100, and other inspection systems can be used with some embodiments. Also, in some embodiments, an FIB tool can be used to mill a hole in a sample, and a separate SEM tool can be used to obtain images of the hole.

Charged Particle Enhanced Deposition Process

Embodiments of the disclosure can use sample evaluation system 100 to deposit material over a sample positioned on support 140 by initiating a deposition process under FIB column 120. As an example, in some embodiments FIB column 120 can be used in a deposition mode to initiate a focused ion beam enhanced deposition process. Towards this end, a deposition gas can be supplied to the sample 150 by gas injection system 160 and energy from the FIB column 120 can generate beam of ions 122. The cascade of imping- ing ions can, in turn, activate the deposition gas resulting in deposition of material on the sample that is localized to the regions of the sample that over which the ion beam is scanned. Thus, deposition that occurs according to such embodiments does not simultaneously occur across the entire surface of the sample or wafer being processed. Instead, deposition occurs only in the general areas where the ion beam (which, as a non-limiting example, can have a diameter in the range of 0.5 to 25 microns for a xenon plasma) impinges upon the wafer and as the ion beam is scanned across those areas of the wafer. Thus, deposition according to some embodiments can be carried out with micron level resolution.

Examples of a Milled Hole

Figure 2:
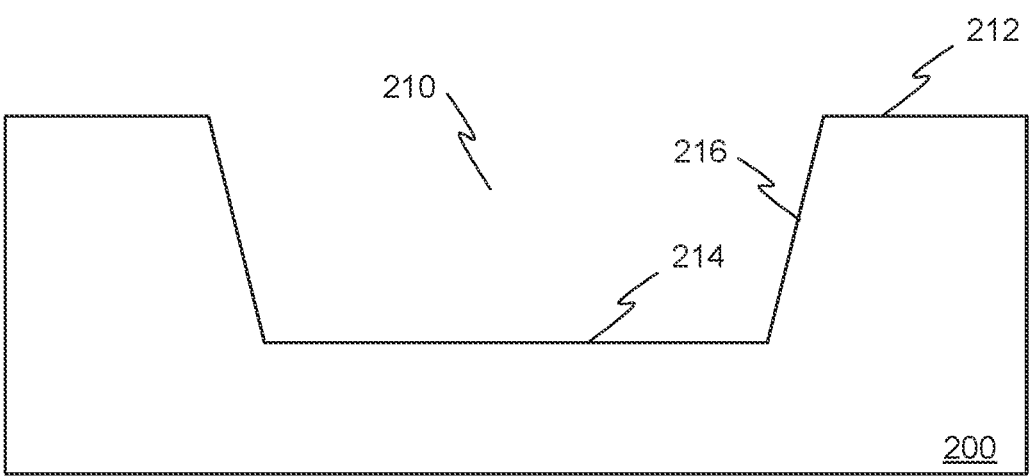
FIG. 2 is a simplified cross-sectional view of a hole milled in a sample using a charged particle beam of an FIB system.

FIG. 2 is a simplified cross-sectional view of a sample 200 having a hole 210 milled therein using a charged particle beam of a FIB system according to an embodiment. Sample 200 can be representative of sample 150 discussed in FIGS. 1A and 1B. Sample 200 can include an top surface 212 of sample 200 in which hole 210 is milled. Hole 210 can then include a bottom surface 214 and a sidewall 216 that can extend between sample surface 212 and hole bottom 214 and, in some instances, can be sloped at an angle as shown in FIG. 2.

Figure 3:
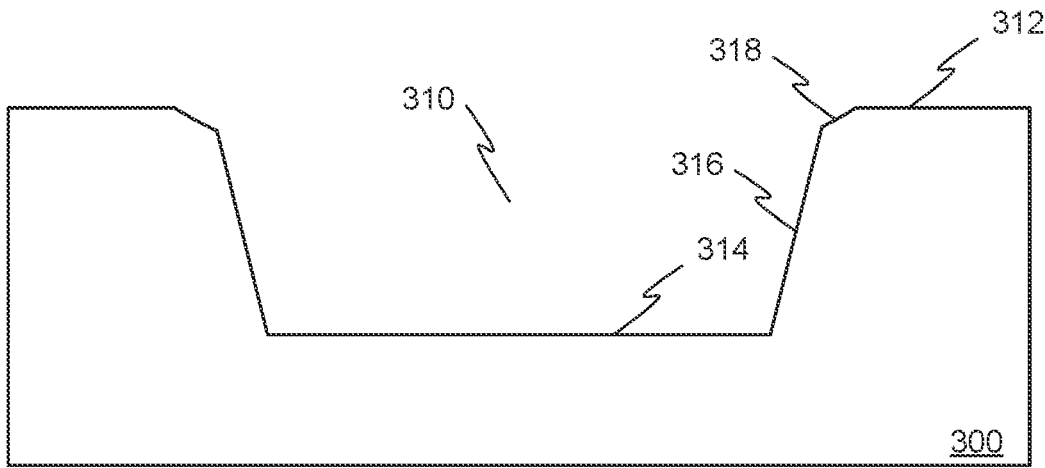
FIG. 3 is a simplified illustration of a hole milled in a sample using a charged particle beam system that creates undesirable damage in an area immediately adjacent to the hole.

Hole 210 is depicted in FIG. 2 as a theoretical, or ideal, shape. In some actual milling processes, top surface 212 can be damaged somewhat during the milling of hole 210. To illustrate, reference is made to FIG. 3, which is a simplified cross-sectional view of a sample 300, similar to sample 200, having a hole 310 milled therein. As shown in FIG. 3, hole 310 is milled from an upper surface 312 of sample 300 and includes a bottom surface 314. A sidewall 316 can extend between sample surface 312 and hole bottom 314 and can be sloped at an angle similar to sidewall 214 discussed above. As can be seen in the example provided in FIG. 3, the sidewall 316 can have a portion with a relatively constant slope angle. Unlike hole sample 200, however, sample 300 includes a damaged area 318 along one or more portions of the periphery of hole 310.

The depth of holes 210 and 310 can be measured in a stereoscopic manner, which is measuring the length between two points from two different perspectives. For example, when a first measurement is taken from a top view perspec- tive and a second measurement is taken from an angled perspective (e.g., a 45 degree tilt), the difference in length between the two measurements is the vertical height of the measured slope (or, alternatively, the depth of the milled hole).

In order for such stereoscopic measurements to be highly accurate, the position of the two points being measured need to be accurately identified. As depicted in FIG. 3, however, a damaged area 318 can exist at the surface 312 of sample 300. Damaged area 318 can be formed, for example, along an outer periphery of hole 310 during the milling process. As a non-limiting example and as discussed above, in some FIB instruments, such as a plasma source FIB system, the focused ion beam can have a relatively large "tail" around the spot which can create damaged area 318 at the surface of the sample. The damaged area 318 surface can make it difficult for top surface 312 of sample 300 to be accurately identified during an SEM imaging process, which in turn, can have an adverse impact on the accuracy when deter- mining the depth of hole 310.

Before explaining how embodiments disclosed herein can accurately determine the depth of a milled hole even when there is damage at the surface of the sample near the hole periphery, such as damaged area 318, examples of how stereoscopic measurements can be made in accordance with some embodiments are first presented below.

General Concepts—Stereoscopic Measurements with an SEM Instrument

Stereoscopic techniques can be used with an imaging device, such as a scanning electron microscope (SEM), to determine the thickness or depth of different structures formed on a sample. One technique for doing such is described in commonly assigned U.S. patent application Ser. No. 17/408,876, filed on Jul. 19, 2021, and entitled "Ana- lyzing a Buried Layer of a Sample". The Ser. No. 17/408, 876 application is incorporated by reference herein in its entirety but, for the sake of convenience, a brief description of the stereoscopic measurement technique set forth in the Ser. No. 17/408,876 application is presented below with reference to FIGS. 4A-8.

Figure 4A:
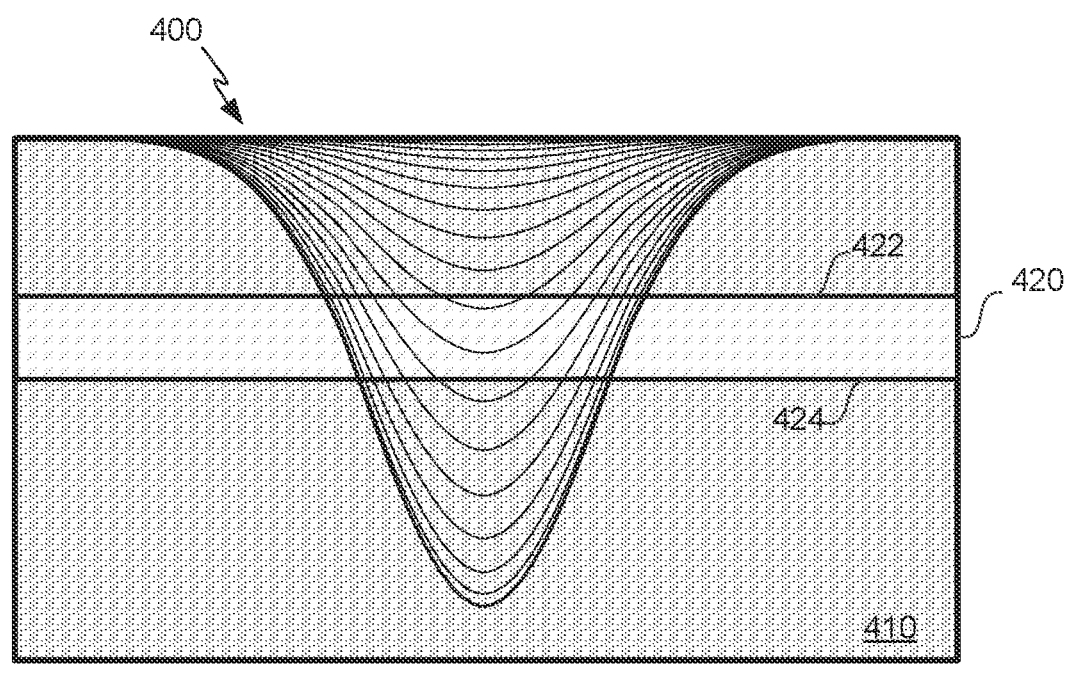
FIGS. 4A-7 are simplified diagrams depicting various views and aspects of a hole that can be measured using stereoscopic measurement techniques described herein.
Figure 4B:
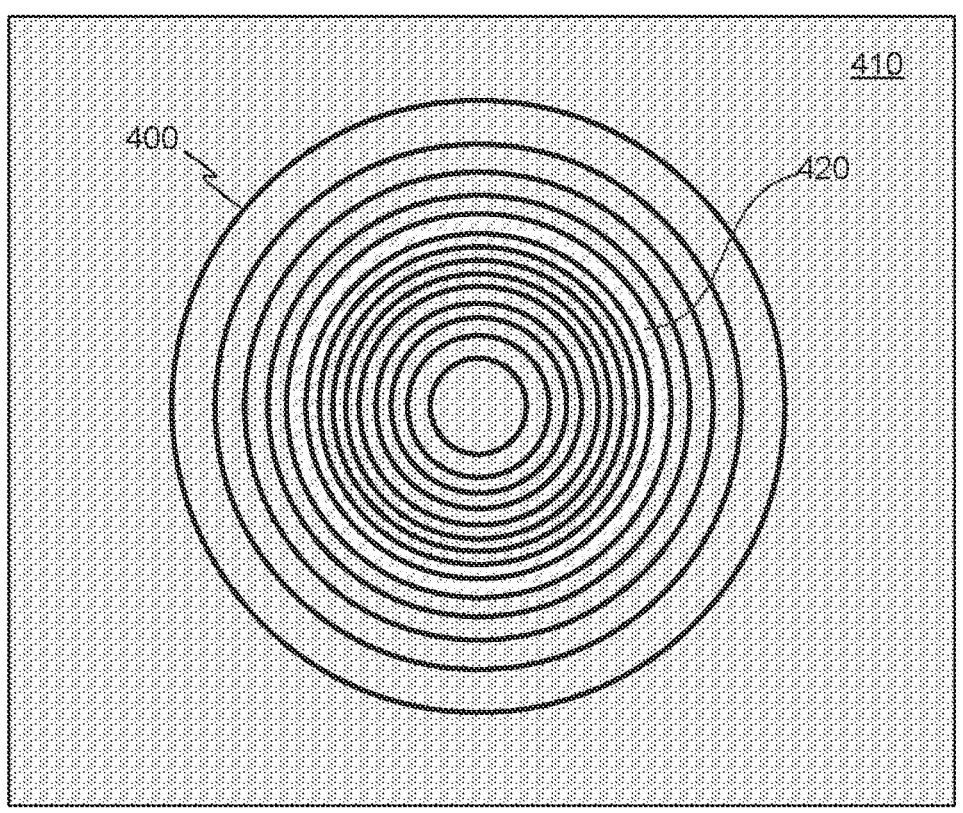

Shown in FIGS. 4A and 4B are simplified cross-sectional and top-down views, respectively, of an example hole 400 that has been milled in a sample 410. The depicted hole 400 includes sloped sidewalls formed in a sample 410. In the example, sample 410 includes a buried layer 420 that has a different composition than sample 410. The buried layer 420 includes an upper surface 422 and a lower surface 424 and the techniques discussed below can be used to determine the height (thickness) of buried layer 420, i.e., the distance between upper surface 422 and lower surface 424.

Figure 4C:
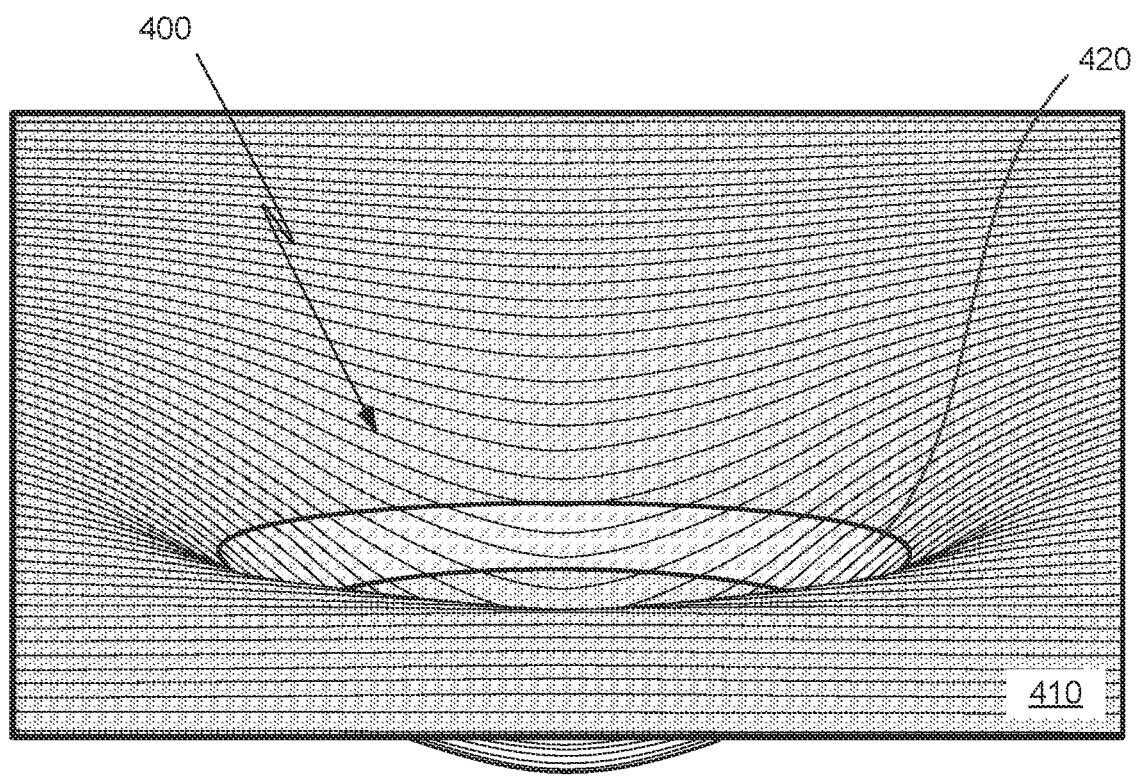

When hole 400 is viewed from different perspectives, the apparent thickness of buried layer 420, as indicated by a distance between a top surface 422 of the buried layer 410 and a bottom surface 424 of the buried layer 410, varies. More specifically, a distance between the top and bottom surfaces 422, 424 of the buried layer 420 increases as a tilt angle increases, reaching a maximum at a particular tilt angle that depends on the slope of the sidewall, and then decreases with further increases in the tilt angle. This is illustrated in a comparison between FIGS. 4B and 4C where FIG. 4C is a simplified illustration of hole 400 shown in FIGS. 4A and 4B from a tilted perspective. From this perspective, the buried layer 420 can be seen along the sloped sidewall of the hole 400. In some embodiments, the tilted perspective can be approximately 45° to a surface of the sample 410 (e.g., within a few degrees).

Figure 5:
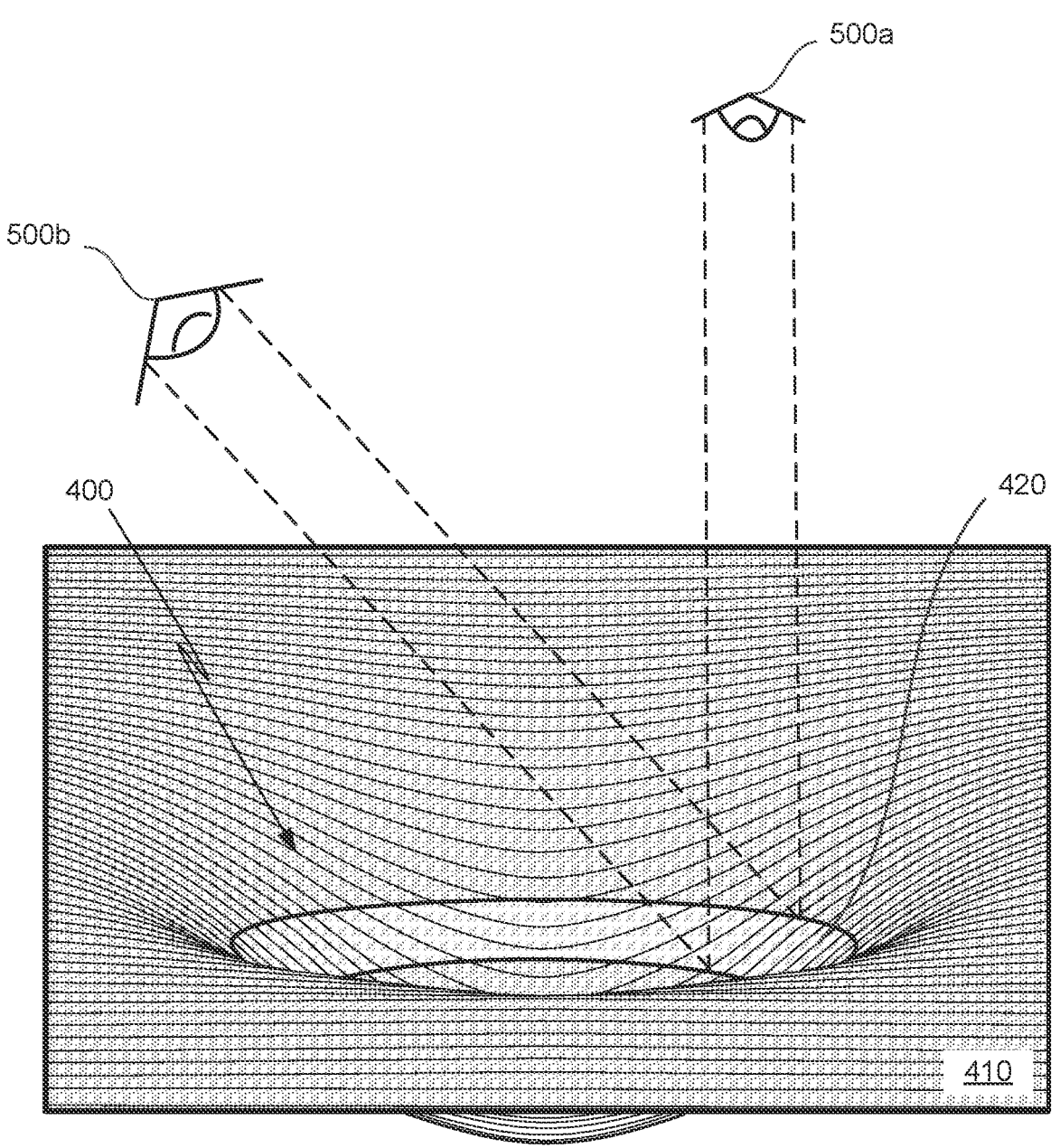

The thickness of the buried layer 420 (a vertical thick- ness) can be determined using distances measured between the top and bottom surfaces of the buried layer as viewed from different perspectives. FIG. 5 is a simplified diagram (at the same tilted perspective as FIG. 4C) illustrating how images of buried layer 420 in the sample 400 on a sidewall of hole 410 can be obtained from different perspectives according to an embodiment. In the depicted example, a first image can be obtained from a first perspective 500a, and a second image can be obtained from a second perspective 500b. The images can be obtained using any type of imaging device or technique that allows distance measurements to be obtained between points in the images. Examples include optical or SEM devices and techniques. Distances between points on the upper and lower surfaces of the buried layer 420 can then be measured using the images. It should be appreciated that a field of view of the imaging device can include a larger portion of the hole 410 (sometimes referred to herein as a spot) or the sample 400 than just the buried layer 420.

Figure 6A:
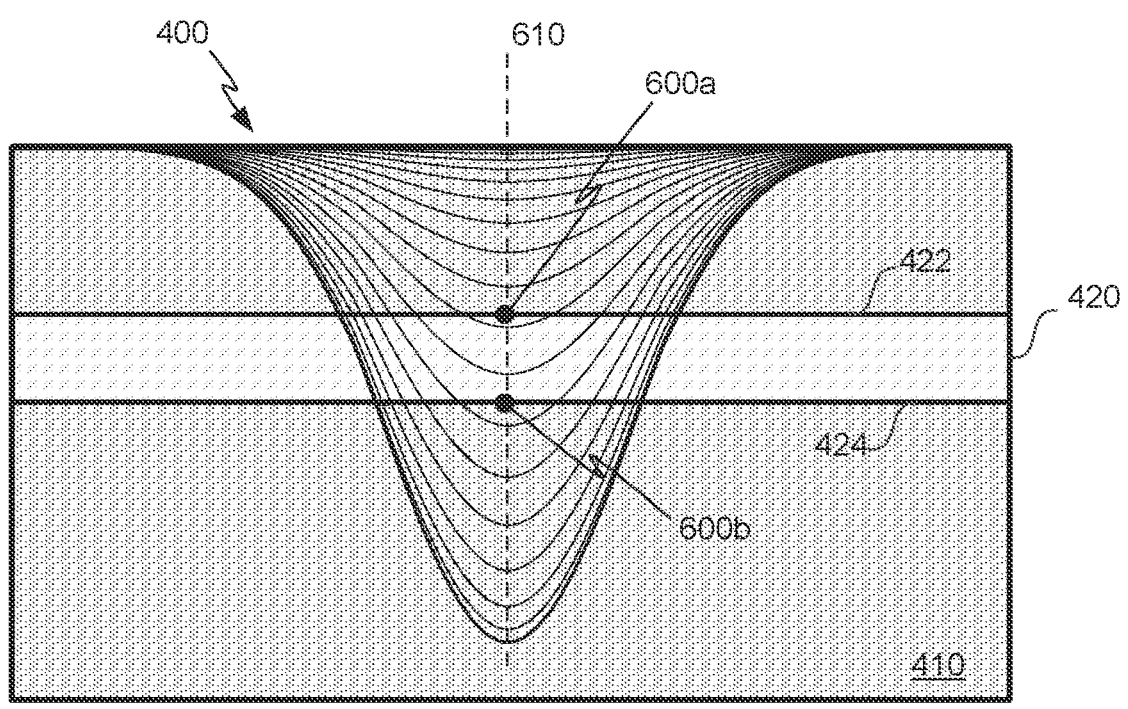
Figure 6B:
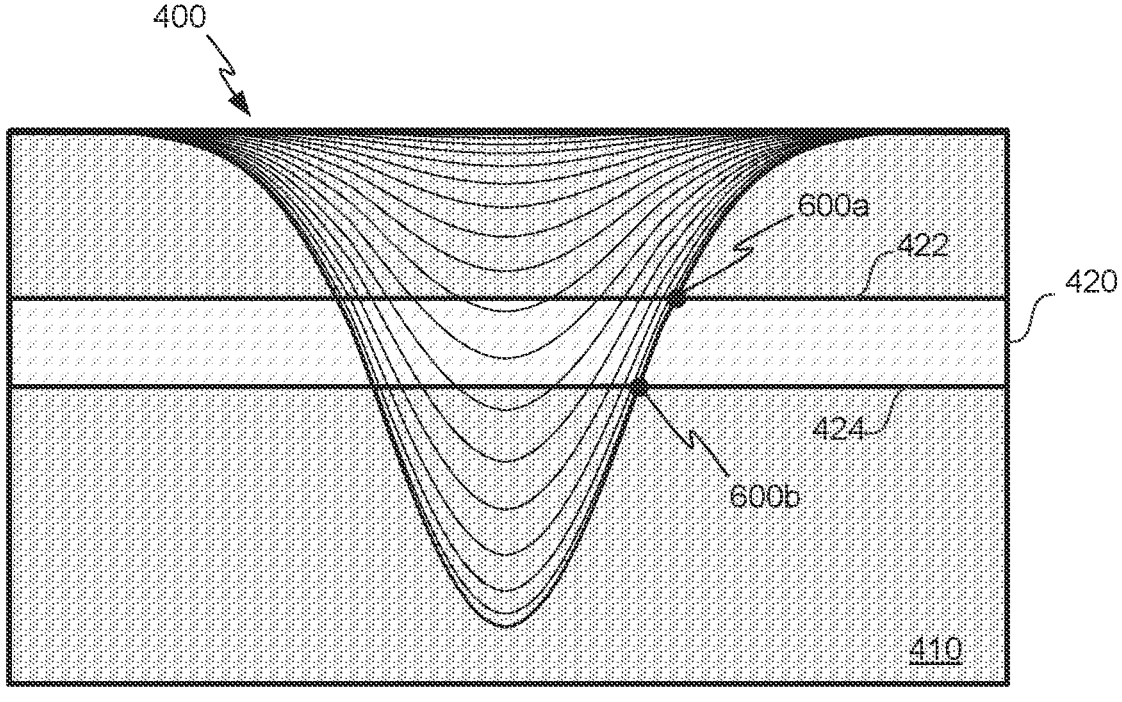

FIGS. 6A and 6B are additional simplified cross-sectional views of hole 400 depicting a first point 600a on upper surface 422 of the buried layer 420 and second point 600b on lower surface 424 of the buried layer 420. The points 600a, 600b can be at locations that have some feature or features that makes the points 600a, 600b identifiable in the images obtained from the different perspectives.

In FIG. 6A, the points 600a, 600b appear to be aligned vertically as shown by dashed line 610. However, FIG. 6B is rotated 90° relative to FIG. 6A and shows that the points 600a, 600b are offset vertically since they are located on the sloped sidewall of the milled hole 400. In practice, one of the points 600a, 600b can be chosen, for example point 600a, and distances can be measured between the point 600a and other points at lower surface 424 of the buried layer 420 that appear to be directly below point 600a. The point associated with the shortest distance can be identified as point 600b. This technique should provide two points that fall approximately on a line 610 extending vertically through the buried layer 420 as shown in FIG. 6A.

Figure 7:
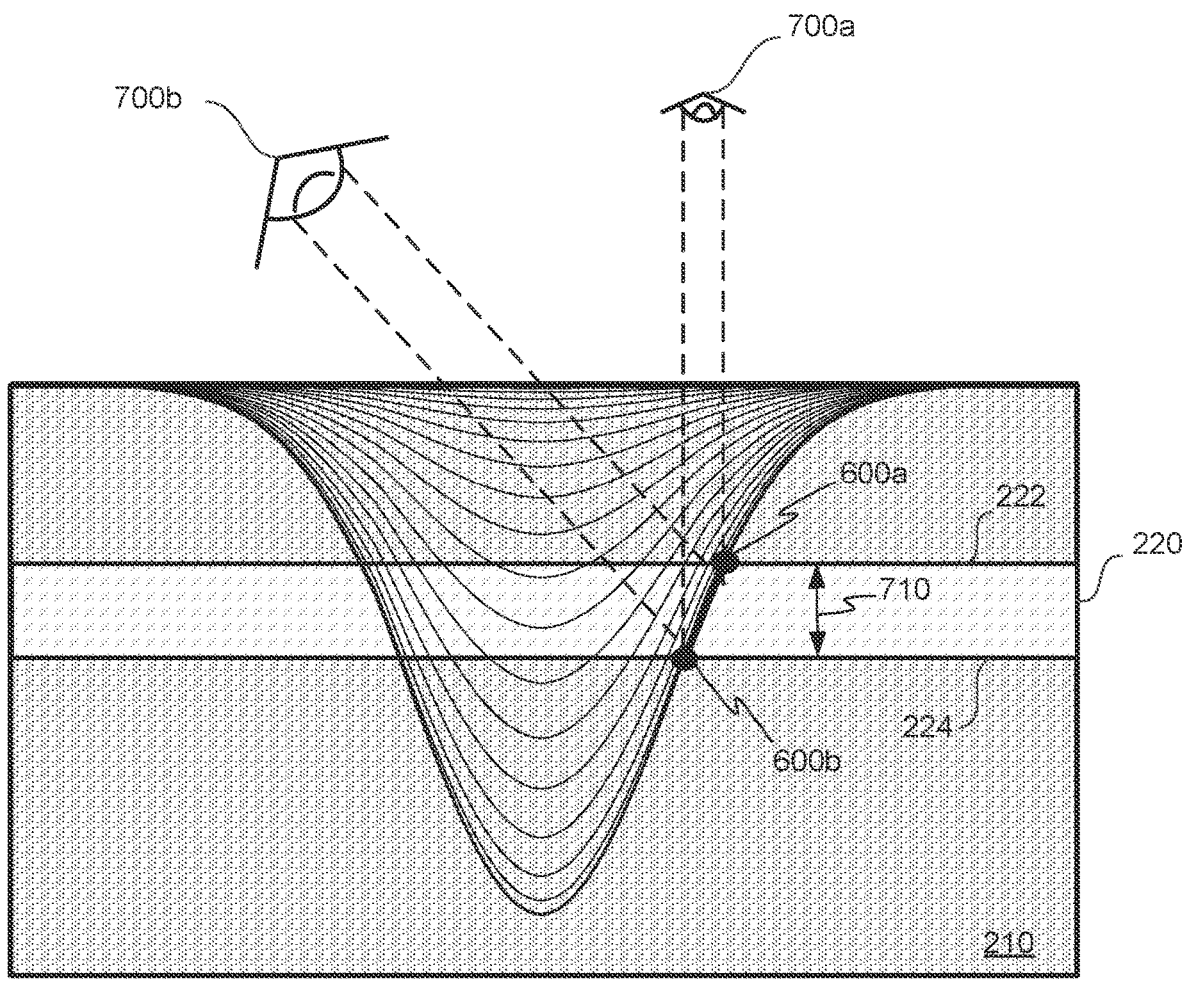

FIG. 7 is a simplified diagram illustrating some of the steps for determining a vertical thickness 710 of buried layer 220 using measured distances between points 600a, 600b. In this example, a first image of the buried layer 220 is obtained from a first perspective 700a, and a second image of the buried layer 220 is obtained from a second perspective 700b. A distance 710 between the points 600a and 600b in each image can be determined using known measurement techniques dependent on the particular imaging device and measurement technique.

Figure 8:
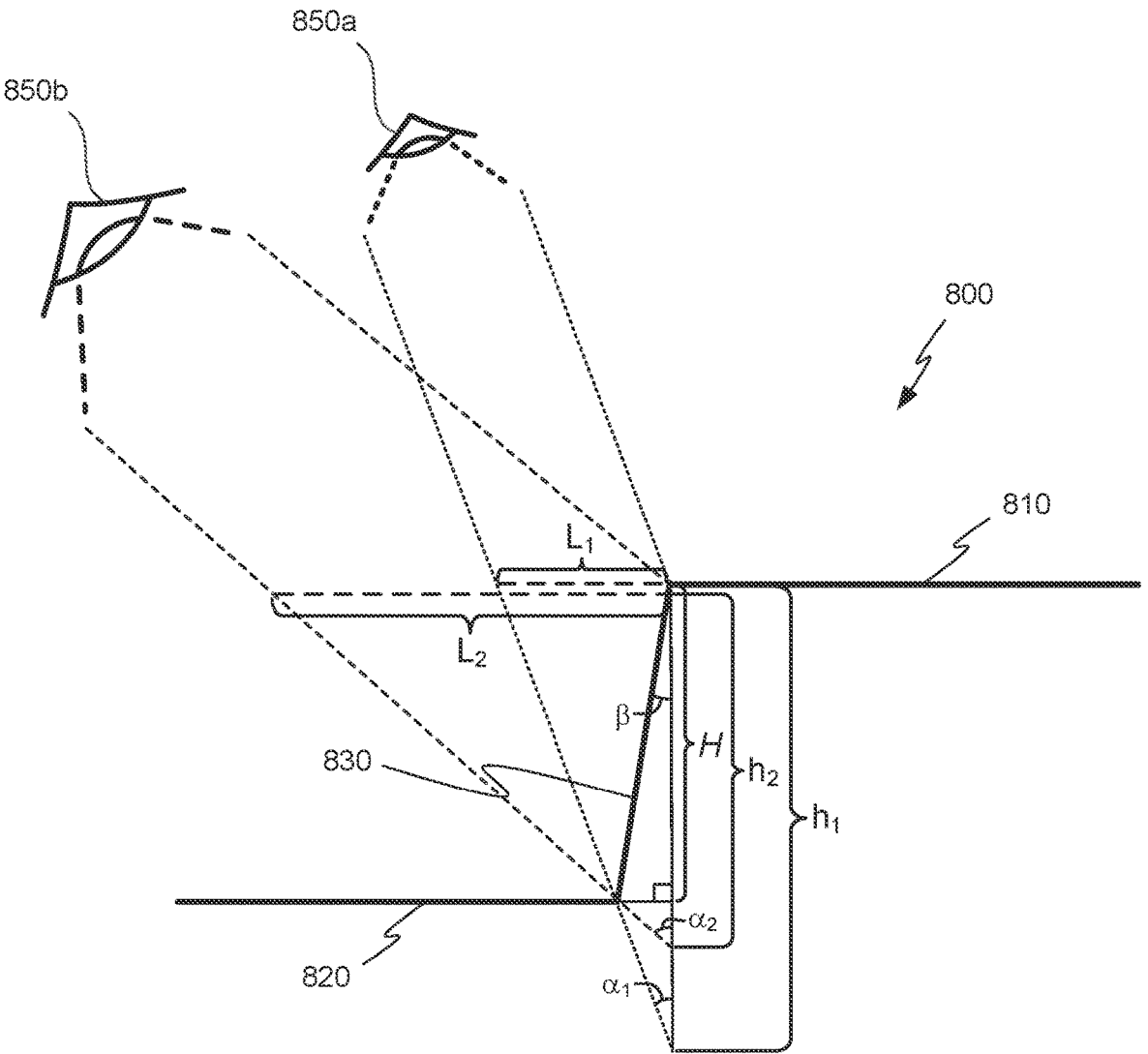
FIG. 8 is a simplified diagram illustrating how stereoscopic measurement techniques can be used to calculate a vertical thickness of a buried layer.

FIG. 8 is a simplified diagram illustrating how a vertical thickness of a structure 800 (such as buried layer 420) or the vertical depth of a hole can be determined according to some embodiments. For ease of illustration, upper and lower surfaces of the structure 800 layer are represented in this figure by horizontal lines 810, 820, respectively. The horizontal lines are connected by a line 830 representing the sidewall of the structure 800 that is sloped at an angle β from the vertical. In this example, a first image of the sidewall is obtained from a first perspective 850a at a first tilt angle $\alpha_1$, and a second image is obtained from a second perspective 850b at a second tilt angle $\alpha_2$. The tilt angles $\alpha_1$ and $\alpha_2$ can be user defined and/or can be obtained from or determined by the imaging device. The vertical thickness (or height or depth) of the structure 800 is represented by H.

When analyzing features from a titled perspective, most conventional SEM imaging devices measure distance projected onto a horizontal or vertical plane. As an example, in FIG. 8 the distance projected onto the horizontal plane from the first perspective 850a is $L_1$, and the distance projected onto the vertical plane from the first perspective is $h_1$. Similarly, the distance projected onto the horizontal plane from the second perspective 850b is $L_2$, and the distance projected onto the vertical plane from the second perspective is $h_2$. In accordance with some embodiments, these measured distances can be used along with the tilt angles $\alpha_1$ and $\alpha_2$ to determine the vertical thickness H of the buried layer 800 using either of the following equations:

$$H = \frac{L2 - L1}{\tan(\alpha 2) - \tan(\alpha 1)} \tag{1}$$

-continued $$H = \frac{h2 \tan(\alpha 2) - h1 \tan(\alpha 1)}{\tan(\alpha 2) - \tan(\alpha 1)} \tag{2}$$

In some instances, the first perspective 850a can be approximately top-down (normal to a surface of the sample), and the second perspective 850b can be approximately 45° to the surface of the sample. In this configuration, the vertical thickness H of the buried layer can be simplified and determined using the equation:

$$H = L2 - L1 \tag{3}$$

Determining the Depth of a Hole Milled at the Surface of a Sample

While the discussion above describes using stereoscopic techniques to determine the thickness of a buried layer, embodiments disclosed herein can use the above described stereoscopic measurement techniques to determine the depth (i.e., height) of a hole milled in a sample. As described above with respect to FIG. 3, in some instances portions of the top surface of a sample surrounding a milled hole present challenges to accurately determining the depth of the milled hole. As one example, such damage can occur when the focused ion beam has a relatively large "tail" or other characteristics that create some level of damage at the top surface. Embodiments disclosed herein can accurately determine the depth of holes even when the top surface is damaged using the techniques described below.

Some embodiments enable the top surface of a sample to be accurately identified by depositing a small amount of material on the surface directly next to the area to be milled. Even if a portion of the small deposition is partly milled during the milling process, the portion of the deposition that remains creates a high contrast boundary between the deposition and the original surface thus accurately identifying the height of the original surface. A point along the high contrast boundary can then be used with the stereoscopic measurement techniques described herein to determine the precise depth of the milled hole.

Figure 9:
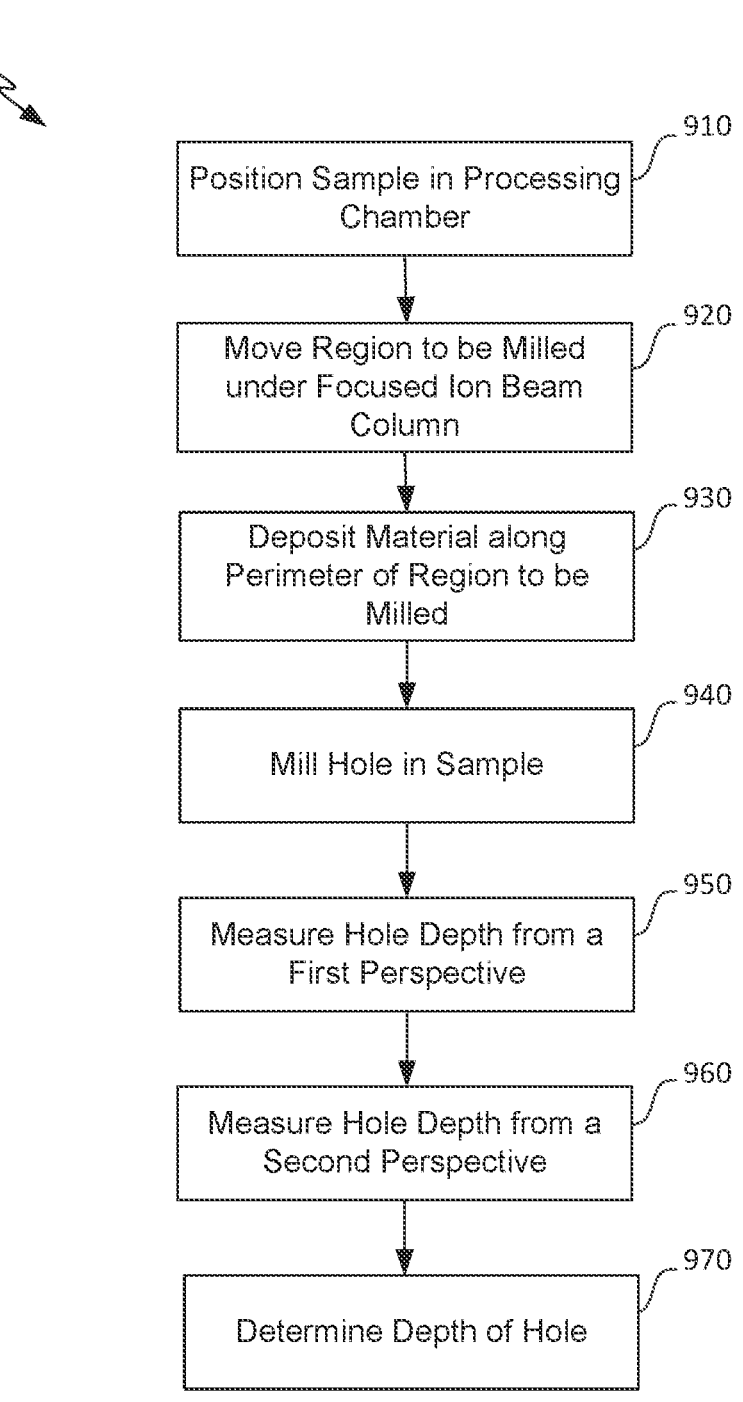
FIG. 9 is a flowchart depicting steps associated a method of determining a depth of a hole milled in a sample according to some embodiments.
Figure 10A:
FIGS. 10A-10D are simplified cross-sectional views of a sample according to some embodiments at different stages of being processed according to the method set forth in FIG. 9.
Figure 10B:
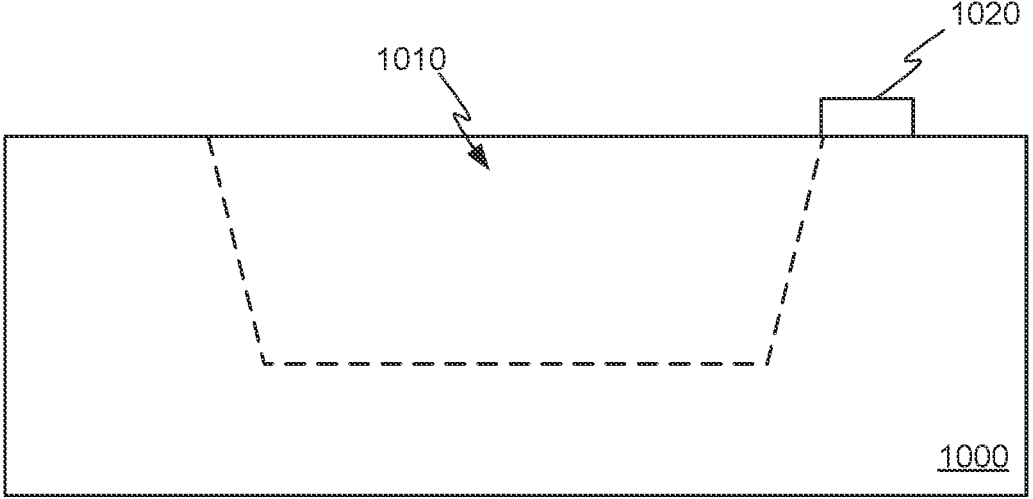
Figure 10C:
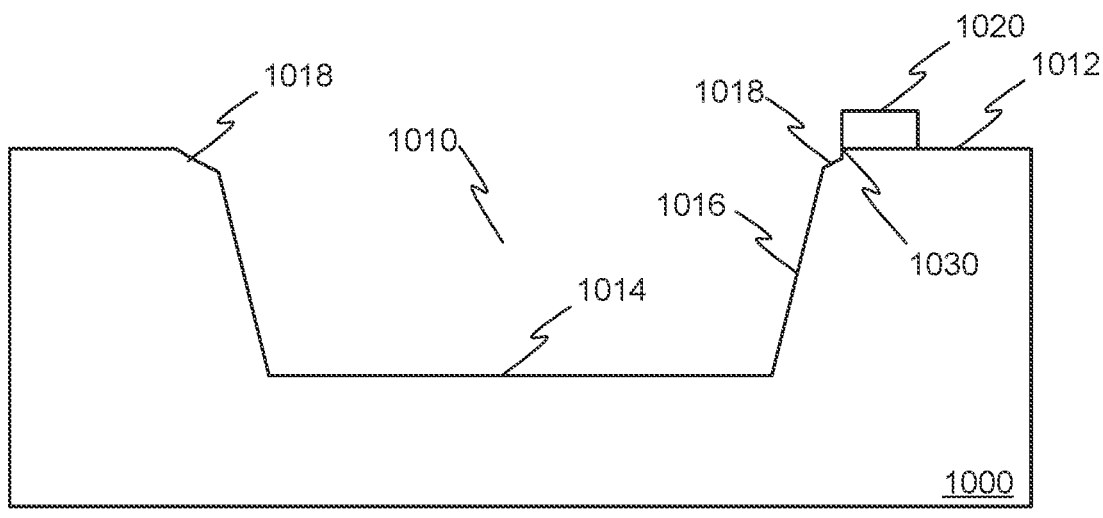
Figure 10D:
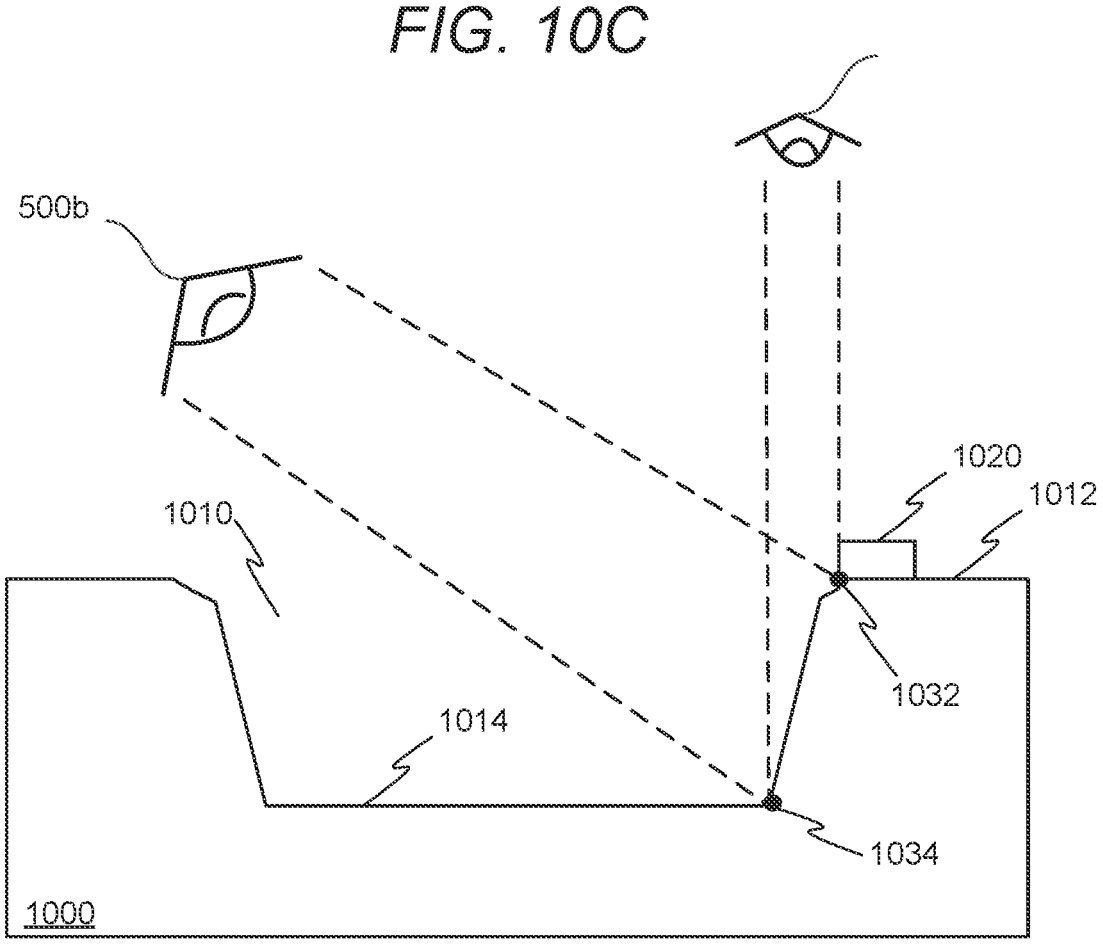
Figure 11A:
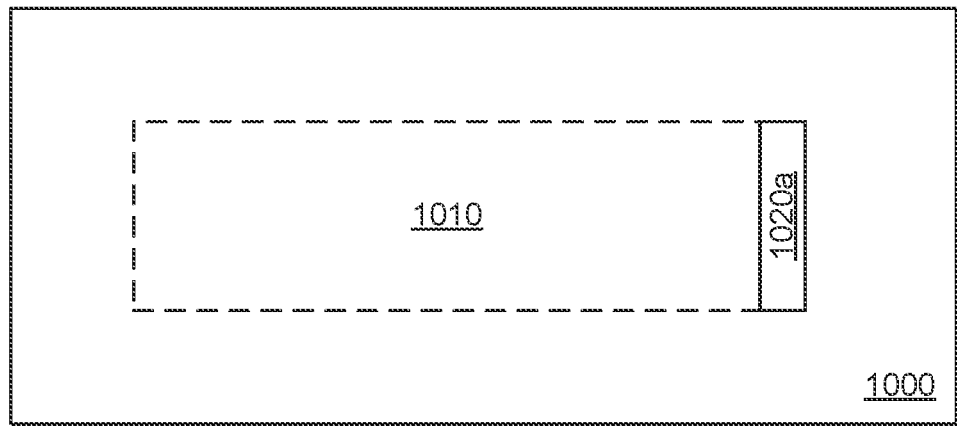
FIGS. 11A-11C are simplified top views of samples having material deposited adjacent to a location in which a hole is to be milled in accordance with some embodiments.
Figure 11B:
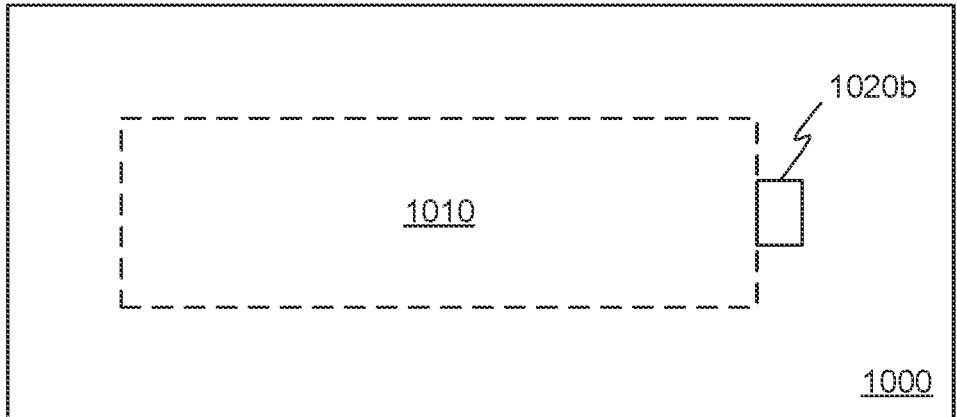
Figure 11C:
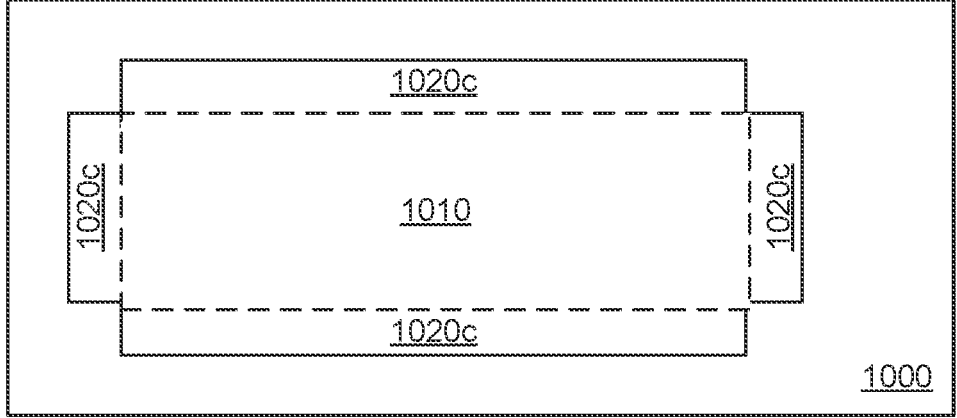

To illustrate, reference is made to FIGS. 9, 10A-10D and 11A-11C. FIG. 9 is a flowchart depicting steps associated with a method 900 according to some embodiments disclosed herein. FIGS. 10A-10D are simplified cross-sectional views of a sample 1000 at different stages of being processed according to method 900. And, FIGS. 11A-11C are simplified top view diagrams depicting different patterns in which material can be deposited over sample 1000 during the implementation of method 900 according to different embodiments.

As shown in FIG. 9, method 900 starts by positioning a sample on a sample support in a chamber of an appropriate evaluation system (step 910). For example, in some embodiments, step 910 includes positioning a sample 1000 (FIG. 10A) on sample support 140 within vacuum chamber 110 of sample evaluation system 100. Sample 1000 can be representative of any of samples 150, 200, 300 or 400 discussed above. The sample 1000 can then be moved under the field of view of the focused ion beam column (step 920) and, as shown in FIG. 10B, material 1020 can be deposited locally in one or more locations directly adjacent to where a hole 1010 (represented by the dashed line) is to be milled in the sample (step 930).

As would be understood by a person of skill in the art, material 1020 can be chosen based on the composition of sample 1000 or the upper most layer of sample 1000 that is to be milled. In general, material 1020 should have properties that present a strong contrast between it and sample 1000 (or the upper most layer of sample 1000)

The deposition of material over sample 1000 in step 930 can be performed in a charged particle enhanced deposition process, such as a focused ion beam deposition process, as described above. For example, an appropriate deposition gas can be supplied to the sample 130 by gas injection system 150 and energy from the FIB column 120 can generate beam of ions 122. The cascade of impinging ions can, in turn, activate the deposition gas resulting in deposition of material on the sample that is localized to the regions of the sample that over which the ion beam is scanned. Thus, system 1000 can control where material 1020 is deposited based on the location of a scan pattern used in step 930. As various non-limiting examples, material 1020 can be deposited along one entire edge of the perimeter of hole 1010 (FIG. 11A), along just a portion of an edge (FIG. 11B), or around the much of or the entire perimeter of where the hole is to be milled (FIG. 11C).

After material 1020 has been deposited, hole 1010 can be milled (step 940) in an upper surface 1012 of sample 1000. The milling process can scan the focused ion beam in a region of the sample that is directly adjacent to a location at which material 1020 was deposited. As shown in FIG. 10C, hole 1010 can include a bottom surface 1014 and a sidewall 1016 that extends between upper surface 1012 and bottom surface 1014.

As described above, in some instances, milling step 940 can create a damaged area 1018 surrounding some or all of the upper periphery of hole 1010. Even if the damaged area etches or mills away some portion of material 1020 closest to the periphery of hole 1010, as long as some material 1020 remains, the interface (boundary) 1030 between the remaining material 1020 and sample 1000 represents the original location of upper surface 1012.

A first point 1032 along interface 1030 and a second point 1034 at the bottom of hole 1010 can then be identified and used to calculate the depth of hole 1010 in accordance with a stereoscopic measurement technique discussed above and depicted graphically in FIG. 10D. Referring back to FIG. 9, the depth of hole 1010 can be determined by measuring a first distance between first point 1032 and second point 1034 from a first perspective (step 950) and then measuring a second distance between the same two points 1032, 1034 from a second perspective (step 960). Once these two measurements have been made, the depth of hole 1010 can be determined using the first distance, the first angle associated with the first perspective, the second distance, and the second angle associated with the second perspective as discussed above with respect to FIG. 8 (step 970).

Example of a Sample to be Milled and Measured

Figure 12:
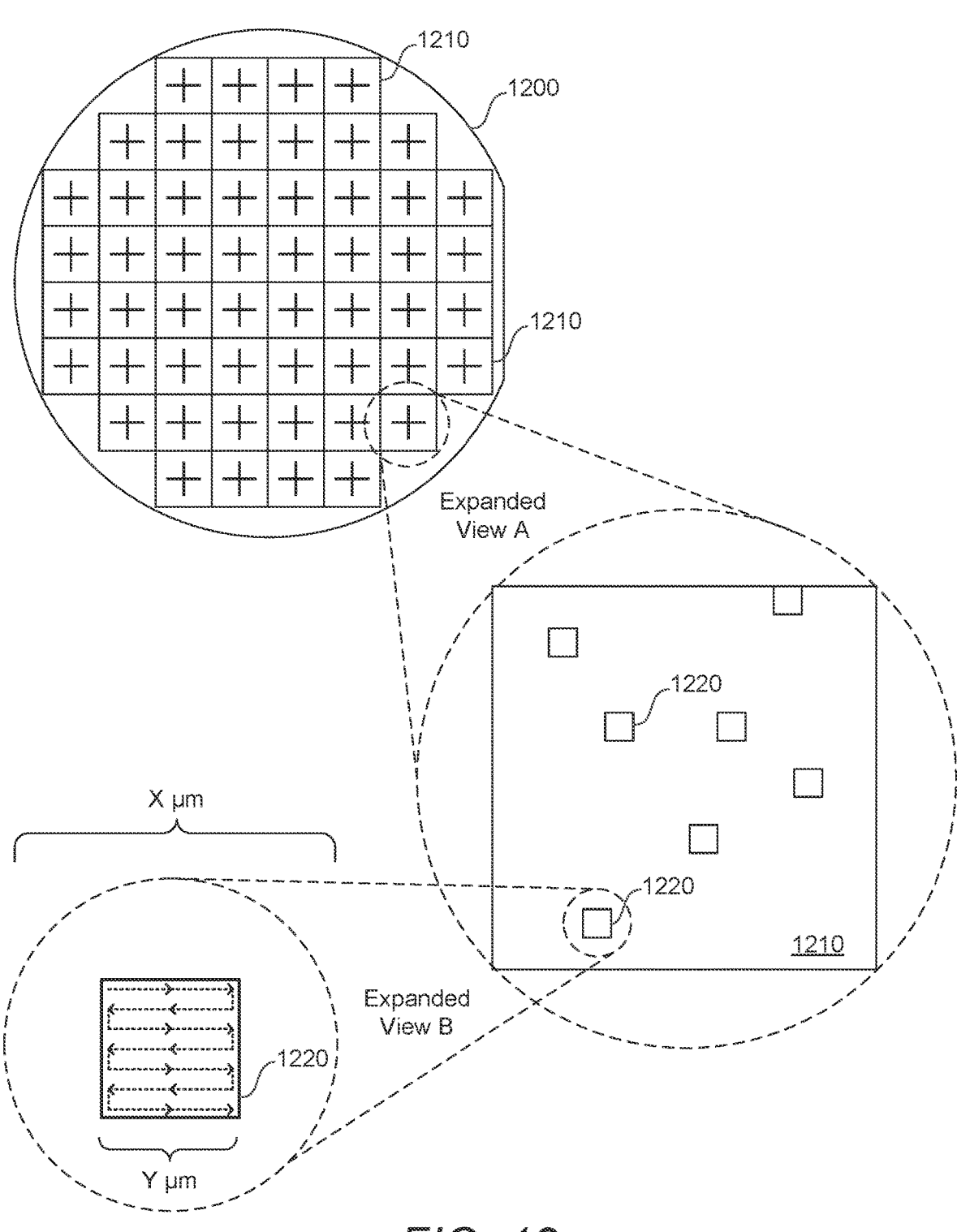
FIG. 12 is a simplified illustration of a sample that can have a structure or buried layer formed thereon and measured in accordance with the embodiments disclosed herein.

As stated above, embodiments of the disclosure can be used to determine the depth of a hole milled in a sample. Embodiments can be used to determine the depth of milled holes within many different types of samples including electronic circuits formed on semiconductor structures, solar cells formed on a polycrystalline or other substrate, nano-structures formed on various substrates and the like. As one non-limiting example, FIG. 12 is a simplified illustration of an area on a semiconductor wafer that can be include a milled hole that can have its depth determined according to embodiments described herein. Specifically, FIG. 12 includes a top view of wafer 1200 along with two expanded views of specific portions of wafer 1200. Wafer 1200 can be, for example, a 150 mm, 200 mm or 300 mm semiconductor wafer and can include multiple integrated circuits 1210 (fifty two in the example depicted) formed thereon. The integrated circuits 1210 can be at an intermediate stage of fabrication and the techniques described herein can be used to evaluate and analyze one or more regions 1220 of the integrated circuits Embodiments of the disclosure can analyze and evaluate region 1220 by sequentially milling away material within the region forming a milled hole. The depth of the milled hole can then be determined as described above. When milling the hoe, the milling process can mill region 1220 by scanning the FIB back and forth within the region according to a raster pattern until the hole has been milled to a desired depth (with the desired slope). Even if the milling process unintentionally damages the top surface of sample 1200 in the area immediately surrounding region 1220, the techniques described herein can be used to accurately determine the depth of the milled hole.

ADDITIONAL EMBODIMENTS

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while the embodiments above described a focused ion column as part of a tool having a single charged particle column, in some embodiments the focused ion beam column can be part of a SEM-FIB tool that has both a scanning electron microscope column and a focused ion beam column. Additionally, while various simplified drawings of holes in which the depth can be measured are discussed herein as examples, it is to be understood that the examples are generally highly simplified drawings for illustrative purposes only. Actual holes milled in samples can have different topographies than those depicted in the figures and embodiments described herein are not limited to any particular shape or topography of milled holes. Additionally, while the profile of holes (e.g., hole 310) are often depicted in the included figures as being smooth, it should be appreciated that the profile can be rough and jagged on a micro-level without significantly impacting the depth measurement techniques described herein.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of determining a depth of a hole milled into a first region of a sample, the method comprising:

positioning the sample in a processing chamber having a charged particle beam column;

prior to milling the hole, depositing material directly over a top surface of the sample in a second region of the sample adjacent to the first region so that the material forms an interface with the top surface;

milling the hole in the first region of the sample using a charged particle beam generated by the charged particle beam column, wherein the milling partially removes the material deposited over the top surface such that a remaining portion of the material forms a high-contrast boundary with the top surface at an original location of the top surface prior to milling and wherein the hole abuts the material deposited over the top surface and includes a sidewall that extends from a bottom surface of the hole to the high-contrast boundary formed at the interface between the remaining deposited material and the top surface of the sample;

obtaining first and second images of the sidewall from different perspectives; and calculating a depth of the hole using stereoscopic measurement techniques based on distances measured in the first and second images between a first point along the high-contrast boundary between the remaining deposited material and the original top surface and a second point along a bottom surface of the hole.

2. The method of determining a depth of a hole milled into a first region of a sample set forth in claim 1 wherein the each of the first and second images are obtained using a scanning electron microscopy (SEM) technique.

3. The method of determining a depth of a hole milled into a first region of a sample set forth in claim 1 wherein the charged particle beam column is a focused ion beam (FIB) column and the charged particle beam is a focused ion beam.

4. The method of determining a depth of a hole milled into a first region of a sample set forth in claim 3 wherein depositing the material comprises:

injecting a deposition precursor gas into the second region of the sample;

generating a focused ion beam with the focused ion beam column and focusing the ion beam within the second region of the sample; and scanning the focused particle beam across the second region of the sample to activate molecules of the deposition gas that have adhered to the sample surface in the deposition region and deposit material on the sample within the second region.

5. The method of determining a depth of a hole milled into a first region of a sample set forth in claim 1 wherein the stereoscopic measurement techniques comprise:

obtaining the first image of the sidewall of the hole, the first image obtained from a first perspective associated with a first angle relative to the sample;

measuring, using the first image, a first distance between a first point on the sidewall at the interface between the deposited material and the top surface of the sample and a second point on the sidewall corresponding to a bottom surface of the hole;

obtaining the second image of the sidewall of the hole, the second image obtained from a second perspective associated with a second angle relative to the sample, wherein the first angle and first perspective are different from the second angle and the second perspective;

measuring, using the second image, a second distance between the first point on the sidewall corresponding to the interface between the deposited material and the top surface of the sample and the second point on the sidewall corresponding to the bottom surface of the hole, wherein the first point and the second point fall approximately on a line extending vertically through the milled hole; and determining a depth of the hole using the first distance, the first angle associated with the first perspective, the second distance, and the second angle associated with the second perspective.

6. The method of determining a depth of a hole milled into a first region of a sample set forth in claim 5 wherein the each of the first and second images are obtained using a scanning electron microscopy (SEM) technique.

7. The method of determining a depth of a hole milled into a first region of a sample set forth in claim 1 wherein the processing chamber is a vacuum chamber that includes both a focused ion beam (FIB) column and a scanning electron microscope (SEM) column.

8. The method of determining a depth of a hole milled into a first region of a sample set forth in claim 1 wherein the sample is a semiconductor wafer.

9. A system for determining a depth of a hole milled into a first region of a sample, the system comprising:

a vacuum chamber;

a sample support configured to hold a sample within the vacuum chamber during a milling process;

a charged particle beam column configured to direct a charged particle beam into the vacuum chamber;

a processor and a memory coupled to the processor, the memory including a plurality of computer-readable instructions that, when executed by the processor, cause the system to:

position the sample in a processing chamber having a charged particle beam column;

prior to milling the hole, deposit material directly over a top surface of the sample in a second region of the sample adjacent to the first region so that the material forms an interface with the top surface;

mill the hole in the first region of the sample using a charged particle beam generated by the charged particle beam column, wherein the milling partially removes the deposited material such that a remaining portion of the material forms a high-contrast boundary with the top surface at an original location of the top surface prior to milling and wherein the hole abuts the material deposited over the top surface and includes a sidewall that extends from a bottom surface of the hole to the high-contrast boundary formed at the interface between the remaining deposited material and the top surface of the sample;

obtain first and second images of the sidewall from different perspectives; and calculate a depth of the hole use stereoscopic measurement techniques on distances measured in the first and second images between a first point along the high-contrast boundary between the remaining deposited material and the top surface and a second point along a bottom surface of the hole.

10. The system for determining a depth of a hole milled into a first region of a sample set forth in claim 9 wherein the each of the first and second images are obtained using a scanning electron microscopy (SEM) technique.

11. The system for determining a depth of a hole milled into a first region of a sample set forth in claim 9 wherein the charged particle beam column is a focused ion beam (FIB) column and the charged particle beam is a focused ion beam.

12. The system for determining a depth of a hole milled into a first region of a sample set forth in claim 11 wherein depositing the material comprises:

injecting a deposition precursor gas into the second region of the sample;

generating a focused ion beam with the focused ion beam column and focusing the ion beam within the second region of the sample; and scanning the focused particle beam across the second region of the sample to activate molecules of the deposition gas that have adhered to the sample surface in the deposition region and deposit material on the sample within the second region.

13. The system for determining a depth of a hole milled into a first region of a sample set forth in claim 9 wherein the processing chamber is a vacuum chamber that includes both a focused ion beam (FIB) column and a scanning electron microscope (SEM) column.

14. A non-transitory computer-readable memory that stores instructions for determining a depth of a hole milled into a first region of a sample by:

positioning the sample in a processing chamber having a charged particle beam column;

prior to milling the hole, depositing material directly over a top surface of the sample in a second region of the sample adjacent to the first region so that the material forms an interface with the top surface;

milling the hole in the first region of the sample using a charged particle beam generated by the charged particle beam column, wherein the milling step partially removes the deposited material such that a remaining portion of the material forms a high-contrast boundary with the top surface at an original location of the top surface prior to milling and wherein the hole abuts the material deposited over the top surface and includes a sidewall that extends from a bottom surface of the hole to the high-contrast boundary formed at the interface between the remaining deposited material and the top surface of the sample;

obtaining first and second images of the sidewall from different perspectives; and calculating a depth of the hole using stereoscopic measurement techniques based on distances measured in the first and second images between a first point along the high-contrast boundary between the remaining deposited material and the top surface and a second point along a bottom surface of the hole.

15. The non-transitory computer-readable memory that stores instructions for determining a depth of a hole milled into a first region of a sample according to claim 14 wherein the each of the first and second images are obtained using a scanning electron microscopy (SEM) technique.

16. The non-transitory computer-readable memory that stores instructions for determining a depth of a hole milled into a first region of a sample according to claim 14 wherein the charged particle beam column is a focused ion beam (FIB) column and the charged particle beam is a focused ion beam.

17. The non-transitory computer-readable memory that stores instructions for determining a depth of a hole milled into a first region of a sample according to claim 14 wherein depositing the material comprises:

injecting a deposition precursor gas into the processing chamber at a location adjacent to the deposition region;

generating a focused ion beam with the focused ion beam column and focusing the ion beam within the deposition region of the sample; and scanning the focused particle beam across the deposition region of the sample to activate molecules of the deposition gas that have adhered to the sample surface in the deposition region and deposit material on the sample within the deposition region.

* * * * *